United States Patent [19]

Agiman

[11] Patent Number: 5,266,884
[45] Date of Patent: Nov. 30, 1993

[54] THRESHOLD CONTROLLED CIRCUIT WITH ENSURED HYSTERESIS PRECEDENCE

[75] Inventor: Dan Agiman, Mission Viejo, Calif.

[73] Assignee: Cherry Semiconductor Corporation, East Greenwich, R.I.

[21] Appl. No.: 878,714

[22] Filed: May 4, 1992

[51] Int. Cl.$^5$ .............................................. G05F 1/56
[52] U.S. Cl. .................................. 323/284; 307/356; 307/358
[58] Field of Search ....................... 323/282, 284, 351; 307/356, 358, 360

[56] References Cited

U.S. PATENT DOCUMENTS 4,679,006 7/1987 Skoutas.
4,887,022 12/1989 Gontowski.

Primary Examiner—Emanuel T. Voeltz
Attorney, Agent, or Firm—Robert M. Asher

[57] ABSTRACT

A threshold controlled circuit in which hysteresis precedence is ensured by greatly enhancing the gain of the hysteresis loop with respect to the regulator control loop. The number of gain stages in the hysteresis loop exceeds the number of gain stages in the control loop. In order to ensure hysteresis precedence, the gain of the hysteresis loop times the regulator control shutdown current must exceed the gain of the control loop multiplied by the hysteresis current.

5 Claims, 2 Drawing Sheets

THRESHOLD CONTROLLED CIRCUIT WITH ENSURED HYSTERESIS PRECEDENCE

BACKGROUND OF THE INVENTION

The present invention is directed to threshold controlled circuits with hysteresis. In particular, the hysteresis precedence circuit of the present invention may be used with undervoltage lockout circuits.

There are numerous circuit applications in which a comparator compares a control voltage with one of a number of thresholds. For example, U.S. Pat. No. 4,887,022 (Gontowski) discloses an undervoltage lockout circuit having a first high threshold which must be reached before the circuit will turn on. Hysteresis is activated so that a second lower threshold is put in place after the supply voltage reaches the first U.S. Pat. No. 4,887,022 can run into problems if control of the supply voltage causes it to drop before the second threshold is activated. This would make the circuit latch somewhere between the two thresholds.

It is an object of the present invention to ensure that the hysteresis will be activated before the control circuit affects the supply voltage. Hysteresis precedence is advantageously ensured by the present invention without the use of time delay circuitry.

SUMMARY OF THE INVENTION

The present invention is directed to a threshold controlled circuit in which the hysteresis loop has a greater gain than the control voltage loop. The threshold controlled circuit of the invention includes a comparator which receives a supply monitoring voltage and a threshold voltage for comparison. The supply monitoring voltage is provided as a function of the supply voltage. The comparator has an output node which is common to the hysteresis loop and the control loop. The control loop includes a control circuit for shutting down a regulator when conducting a shutdown current. The hysteresis loop selects the threshold voltage to be used by the comparator. The hysteresis loop has a gain which when multiplied by the shutdown current, exceeds the product of the gain of the control loop multiplied by the hysteresis current.

The increased gain sufficient to achieve the present invention may be satisfied by providing a plurality of gain stages in the hysteresis loop. The number of hysteresis gain stages should be greater than the number of gain stages applying gain to the control loop. By providing a higher gain in the hysteresis loop than the control loop, the present invention ensures that the hysteresis will be activated before the regulator affects the supply voltage.

Other objects and advantages of the invention will become apparent during the following description of the presently preferred embodiment of the invention taken in conjunction with the drawings.

DETAILED DESCRIPTION OF THE PREFERRED EMBODIMENT

Figure 1:
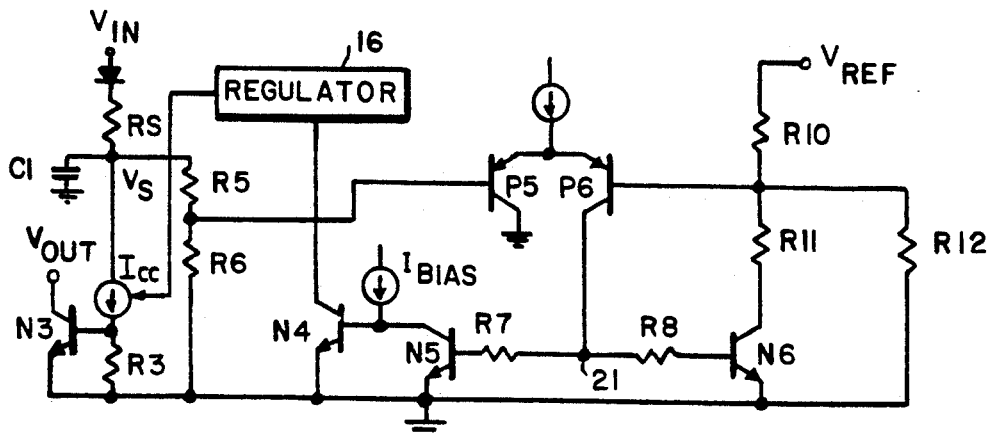
FIG. 1 is a simplified schematic of the prior art circuit disclosed in U.S. Pat. No. 4,887,022.

In the prior art circuit of FIG. 1, transistors P5 and P6 form a comparator. A supply voltage Vs is connected to a resistor divider formed by R5 and R6. The resistor divider provides a supply monitoring voltage to the base of transistor P5. The supply monitoring voltage is a function of the supply voltage and may be provided by any number of techniques, the resistor divider merely being the presently preferred embodiment. The voltage at the collector of transistor P5 is relatively constant. The base of transistor P6 is connected to receive a threshold voltage. There is a hysteresis transistor N6 which selects the threshold voltage connected to transistor P6. With transistor N6 off, the threshold voltage is selected by the resistor divider of resistor R10 and resistor R12. When transistor N6 is turned on, R11 and R12 are in parallel thereby lowering the threshold voltage applied to the base of transistor P6. The output of the comparator at the collector of transistor P6 is common to the hysteresis loop and the output control loop. The hysteresis transistor N6 is the only transistor to provide a gain from the output node to the hysteresis output at the collector of transistor N6. In the control loop, both transistors N5 and N4 enhance the gain from the output node. The output at the collector of transistor N4 is used to control a regulator 16. When transistor N4 turns on, a shutdown current is pulled down from the regulator 16 through the collector of transistor N4. This shuts off the regulator which in turn affects the device current $I_{CC}$ and the output voltage Vout. This is shown schematically by a control line from the regulator to the device current $I_{CC}$. The output voltage Vout is shown schematically taken from a transistor N3 with a base emitter resistor R3. As the supply voltage rises above the upper threshold, transistor N4 is shut off enabling the regulator 16. The regulator 16 pushes $I_{CC}$ to its highest level. This will have the effect through resistor Rs of lowering the supply voltage Vs. In FIG. 1, there is a higher gain from the comparator output node to the control output than there is from the comparator output node to the hysteresis output at the collector of transistor N6. Thus, the supply voltage Vs can be lowered by the feedback effect of turning on the regulator before the threshold at the base of transistor P6 is lowered. As a result in accordance with the prior art, it is possible under low voltage supply conditions for the control voltage to get stuck at a level between upper and lower thresholds.

Figure 2:
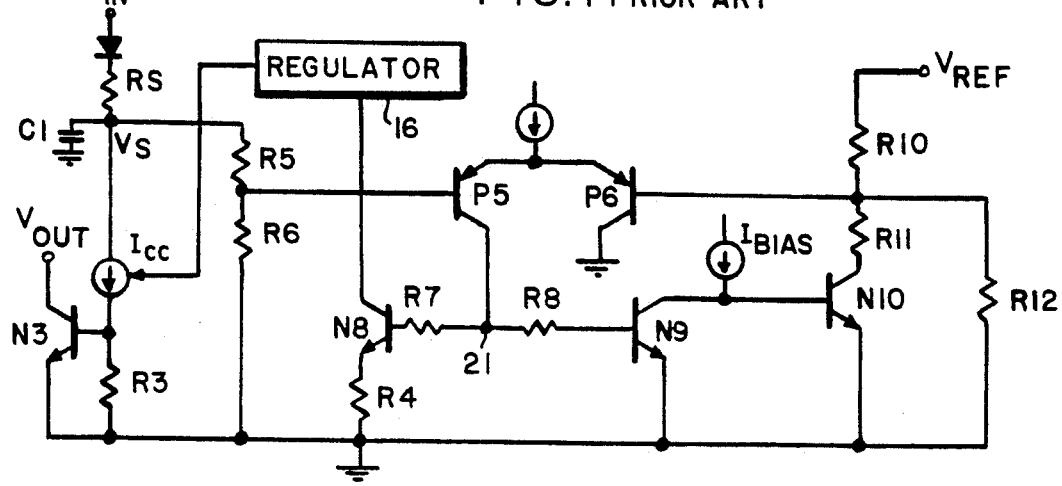
FIG. 2 is a simplified schematic of the threshold controlled circuit of the present invention for use in place of the circuit of FIG. 1.

The circuitry of the present invention is shown in FIG. 2 for substitution into the prior art undervoltage lockout circuit. The same comparator consisting of transistors P5 and P6 is shown. This time, however, the comparator output node is taken at the collector of transistor P5 and the voltage at the collector of transistor P6 is relative constant. As before, the base of transistor P5 is connected to a supply monitoring voltage formed by a voltage divider of resistors R5 and R6. This gives the comparator the opportunity to compare the voltage provided by the supply with a threshold set at the base of transistor P6. Hysteresis transistor N10 permits the threshold to switch from a voltage divider consisting of R10 and R12 to a voltage divider in which R11 is in parallel with resistor R12.

In accordance with the present invention, a plurality of gain stages are provided in the hysteresis loop. In the presently preferred embodiment, the hysteresis transistors are arranged in a common emitter configuration. A first hysteresis transistor N9 has a base coupled through a resistor R8 to the output node of the comparator. The emitter of the first hysteresis transistor N9 is connected to ground as is the emitter of the second and last hysteresis transistor N10. The collector of hysteresis transistor N9 is connected to the base of hysteresis transistor N10. A bias current is fed to the junction of the collector of transistor N9 and the base of transistor N10. The hysteresis transistors are arranged so that they both enhance the gain of the voltage from the output node of the comparator to the collector on the last hysteresis transistor where the hysteresis current flows for adjusting the threshold voltage. The hysteresis current is the current that flows through the collector of hysterisis transistor N10 when it is turned on.

Referring now to the control loop of the circuit of the invention, there is only a single gain stage formed by control transistor N8. The base of control transistor N8 is coupled through a resistor R7 to the output node of the comparator. When control transistor N8 is on, the regulator 16 is pulled down by a shutdown current through the collector of transistor N8 disabling the regulator. The state of the regulator has an impact on the device current. This is shown schematically by a control line to the device current $I_{CC}$. The output voltage Vout to the device is schematically shown as provided by the collector of a transistor N3 with a base-emitter resistor R3. When control transistor N8 is off and the regulator 16 is on, $I_{CC}$ is at its highest level. The increased current level through power line buffer resistor Rs causes Vs to drop some. It is an object of the present invention to activate the hysteresis before Vs drops in response to the regulator turning on.

In accordance with the circuit of the present invention illustrated in FIG. 2, the hysteresis loop includes two gain stages whereas the regulated control loop contains only a single gain stage. By providing the extra stage in the hysteresis loop, it is fairly certain that the gain in the hysteresis loop is sufficiently larger than the gain of the control loop so as to ensure hysteresis precedence. However, to be more specific, in order to ensure hysteresis precedence, the relationship of the hysteresis current through the collector of the last hysteresis transistor N10 needs to be considered with respect to the output current conducted through the collector of control transistor Ns. In accordance with the present invention, it has been found that hysteresis precedence will be ensured so long as the gain in the hysteresis loop multiplied by the output control current exceeds the gain in the control loop multiplied by the hysteresis current. A resistor R4 can be inserted between the emitter of control transistor N4 and ground to further reduce the gain in the control loop.

Figure 3:
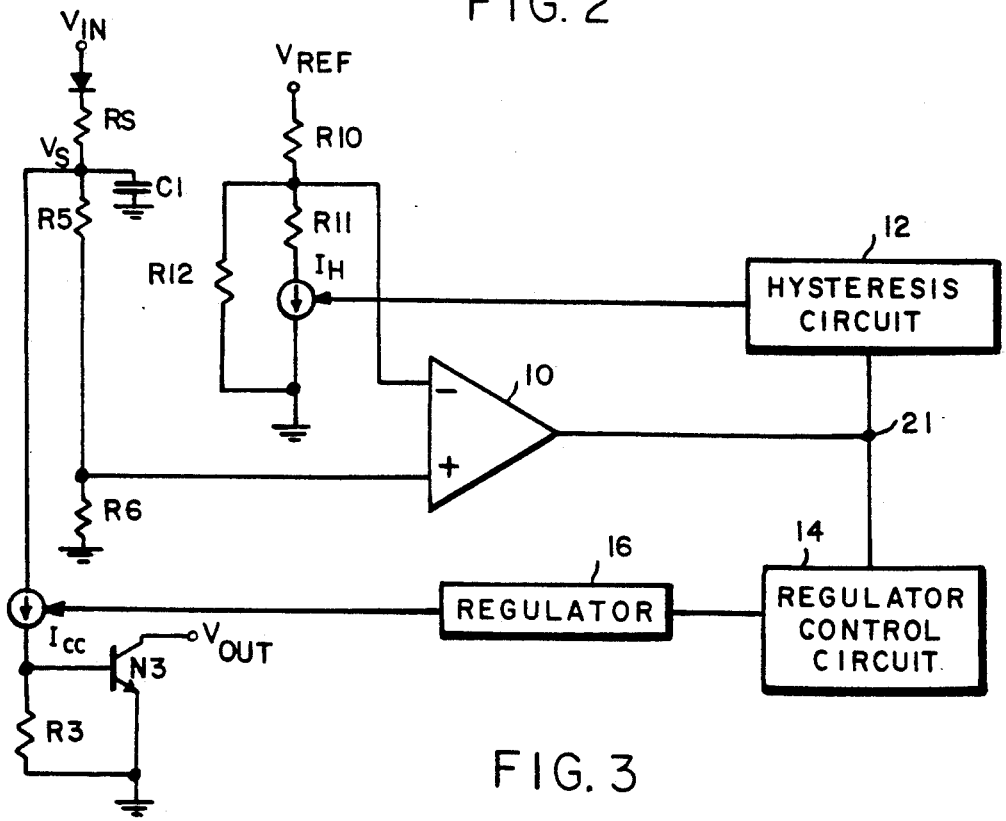
FIG. 3 is a schematic block diagram of a circuit to which the present invention can be applied.

Referring now to FIG. 3, the basic circuit for using the present invention is shown. A comparator 10 is shown as a differential amplifier. The comparator 10 receives a threshold voltage from a voltage divider acting on a reference voltage $V_{REF}$. A hysteresis circuit 12 controls a hysteresis current which switches resistor R11 either into or out of the voltage divider. A control voltage for monitoring the supply voltage is provided to the other input of the comparator 10. The output from the comparator 10 is provided to both the hysteresis circuit 12 and a regulator control circuit 14. The regulator control circuit 14 operates to enable or disable the regulator 16 In the undervoltage lockout circuit, the supply voltage Vs must stay above a minimum level otherwise the circuit will be shut down. Upon turning on, the supply voltage Vs must rise above an upper threshold before the regulator will be turned back on. Turning on the regulator 16 causes a feedback effect on the device current $I_{CC}$ which can in turn lower the supply voltage Vs. In order to ensure in this arrangement of the present invention that the hysteresis is activated before the control circuit affects the supply voltage, the gain of the hysteresis circuit must be much greater than the gain of the control circuit. To be more specific, the gain of the hysteresis circuit multiplied by the regulator shutdown current must be greater than the gain of the control circuit multiplied by the hysteresis current. The gain of the hysteresis circuit is defined as the relationship between the output voltage differential of the hysteresis circuit 12 divided by a voltage differential of the input to the hysteresis circuit 12. The gain of the control circuit is defined as the relationship between the control output voltage differential divided by a voltage differential at the input to the control circuit 14.

Figure 4:
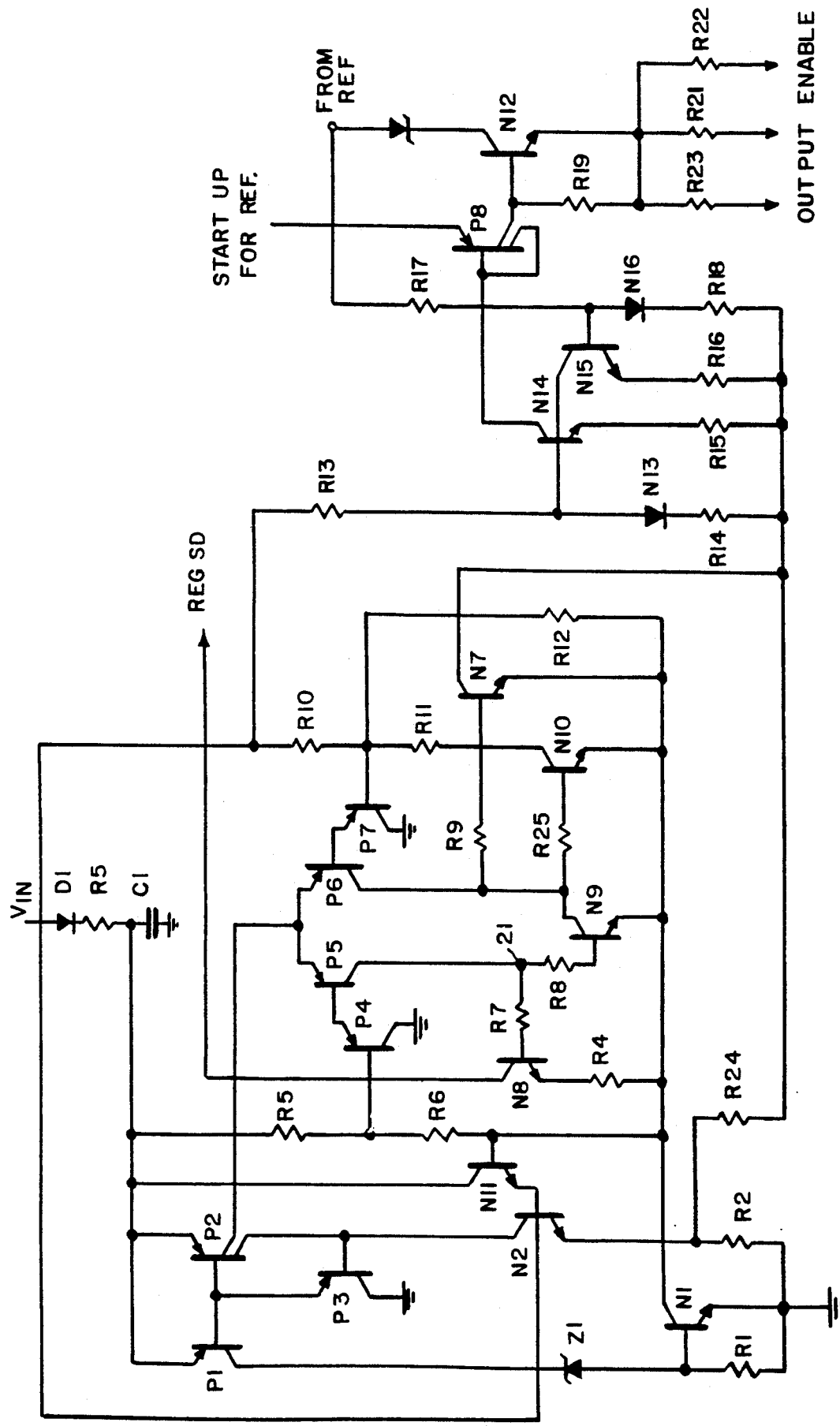
FIG. 4 is a schematic diagram of an undervoltage lockout circuit with the present invention.

FIG. 4 is a schematic diagram of the ensured hysteresis precedence circuit used in an undervoltage lockout circuit such as that previously disclosed in U.S. Pat. No. 4,887,022. Advantageously, this circuit has two hysteresis gain stages including transistors N9 and N10 as compared with one control gain stage, transistor N8. This ensures that hysteresis will kick in before the feedback effect from the control circuit lowers the supply voltage Vs.

Of course, it should be understood that various changes and modifications to the preferred embodiment described above will be apparent to those skilled in the art. For example, there may be three transistors in the hysteresis loop and two transistors in the regulated control loop. Generally, if the number of stages contributing to the gain of the hysteresis loop exceeds the number of stages contributing to the gain in the control loop then hysteresis precedence in accordance with the present invention will be ensured. These and other changes can be made without departing from the spirit and scope of the invention and without diminishing its attendant advantages. It is therefore intended that such changes and modifications be covered by the following claims.

I claim:

1. A threshold controlled circuit comprising:
   means for providing a supply monitoring voltage as a function of a supply voltage;
   a comparator having an output node with a voltage responsive to the supply monitoring voltage and a threshold voltage received by said comparator;
   a control circuit connected to the output node of said comparator for applying a control gain to said output node to operate a shutdown control line to a regulator, said regulator shutting down when said control circuit pulls a shutdown current through said shutdown control line and said regulator controlling a device current wherein sudden changes of said device current causes the supply voltage to change; and
   a hysteresis circuit connected to the output node of said comparator for applying a hysteresis gain to said output node to generate said threshold voltage at a hysteresis current, wherein said hysteresis gain multiplied by said shutdown current exceeds said control gain multiplied by said hysteresis current.

2. The threshold controlled circuit of claim 1 wherein said means for providing a supply monitoring voltage comprises a resistor divider.

3. A threshold controlled circuit comprising:
a supply voltage responsive to a device current controlled by a regulator;
means for providing a supply monitoring voltage as a function of the supply voltage;
a comparator having an output node with a voltage responsive to the supply monitoring voltage and a threshold voltage received by said comparator;
at least one control gain stage coupled to said output node having a collector for shutting down the regulator when said collector conducts a shutdown current; and
a plurality of hysteresis gain stages outnumbering said at least one control gain stage, a first of said hysteresis gain stages including a hysteresis transistor having a base coupled to said output node and a collector connected to a base of a second hysteresis transistor in a second hysteresis gain stage, said plurality of hysteresis gain stages providing said threshold voltage at a hysteresis current from among a plurality of selectable threshold voltages.

4. The threshold controlled circuit of claim 3 wherein said hysteresis gain stages have a gain which when multiplied by said shutdown current exceeds the gain of said at least one control gain stage multiplied by said hysteresis current.

5. A comparator circuit for controlling a regulator comprising:
a supply voltage responsive to the regulator;
means for providing a supply monitoring voltage as a function of said supply voltage;
a comparator having an output node with a voltage responsive to the supply monitoring voltage and a threshold voltage both received by said comparator;
a control transistor having a base coupled to said output node, an emitter coupled to ground and a collector for shutting down the regulator;
a plurality of hysteresis transistors connected in a common emitter configuration for selecting one of a plurality of threshold voltages, said plurality of hysteresis transistors including a first transistor with a base coupled to said output node and a last transistor with a collector coupled to said comparator where said comparator receives said threshold voltage, said plurality of hysteresis transistors being greater in number than any transistors including said control transistor that are provided as gain stages in said comparator circuit between said output node and the collector of said control transistor.

* * * * *